United States Patent [19]

Tigges

[11] Patent Number: 5,264,733
[45] Date of Patent: Nov. 23, 1993

[54] INDUCTIVE PROXIMITY SWITCH

[75] Inventor: Burkhard Tigges, Balve, Fed. Rep. of Germany

[73] Assignee: Werner Turck GmbH & Co. KG, Fed. Rep. of Germany

[21] Appl. No.: 771,108

[22] Filed: Oct. 4, 1991

[30] Foreign Application Priority Data

Oct. 4, 1990 [DE] Fed. Rep. of Germany ....... 4031252
Jan. 29, 1991 [DE] Fed. Rep. of Germany ....... 4102542

[51] Int. Cl.$^5$ .................. H01H 36/00; G01N 27/72; G01R 33/12
[52] U.S. Cl. .................. 307/116; 307/309; 324/236; 324/207.16; 331/65
[58] Field of Search ............. 361/179, 180; 307/309, 307/116; 340/870.31–870.33, 870.36, 572, 870.35; 324/207.15, 207.16, 207.26, 236, 237, 207.18; 331/65; 336/179

[56] References Cited

U.S. PATENT DOCUMENTS

| | | | |
|---|---|---|---|
| 3,805,185 | 4/1974 | Kishi | 331/65 |
| 4,091,833 | 5/1978 | Ellis et al. | 331/65 |
| 4,350,954 | 9/1982 | Seilly | 324/236 |
| 4,513,257 | 4/1985 | Miyamoto et al. | 331/65 |
| 4,587,486 | 5/1986 | Soyck | 324/236 |
| 4,677,384 | 6/1987 | Payne | 324/329 |
| 4,719,362 | 1/1988 | Nest et al. | 307/116 |
| 4,757,213 | 7/1988 | Tigges et al. | 307/116 |
| 4,879,531 | 11/1989 | Tigges et al. | 331/65 |
| 5,012,206 | 4/1991 | Tigges | 331/65 |

FOREIGN PATENT DOCUMENTS

| | | |
|---|---|---|
| 0070796 | 6/1982 | European Pat. Off. |
| 265844 | 10/1987 | European Pat. Off. |
| 1286099 | 10/1967 | Fed. Rep. of Germany |
| 1951137 | 5/1971 | Fed. Rep. of Germany |
| 1966178 | 1/1972 | Fed. Rep. of Germany |
| 2515654 | 4/1975 | Fed. Rep. of Germany |
| 3221888 | 6/1982 | Fed. Rep. of Germany |
| 3326476 | 2/1985 | Fed. Rep. of Germany |
| 3527650 | 2/1987 | Fed. Rep. of Germany |
| 3714433 | 4/1987 | Fed. Rep. of Germany |
| 3814131 | 4/1988 | Fed. Rep. of Germany |
| 3840532 | 12/1988 | Fed. Rep. of Germany |

OTHER PUBLICATIONS

Mutron Katalog '73H Nettopreise Ohne Mehrwertsteuer, Distribution und Fachgrosshandel, Muller & Co. KgIhr Lieferant fur aktive, passive und elektromechanisch Elektronik-Bauteile und Zubehor, p. 690, no English translation.

Gekoppelt Vereinfachte Signal aufbereitung fur Langenmessungen, John Sylvan/Otto Panvitius, Elektronik Prazis-Nr. 11-Jun. 7, 1990, pp. 68–70 and 75, no English translation.

"Transducers, Theory & Applications", Allocca, et al., Reston Publishing Company, 1984, pp. 69–88.

Primary Examiner—A. D. Pellinen
Assistant Examiner—Richard T. Elms
Attorney, Agent, or Firm—Antonelli, Terry, Stout & Kraus

[57] ABSTRACT

An inductive proximity switch contains an oscillator that generates an alternating magnetic field and which, when a trigger penetrates the alternating field, changes its oscillating state. An evaluation circuit uses the change in state to generate a switching signal to control a load switch. To achieve a proximity switch response distance that is as large as possible regardless of the trigger material and the ambient temperature, two sensing coils are located in the alternating field to detect the difference between voltages induced in them. The sensing coils are designed so that the alternating voltage differential becomes zero at a desired response distance. When the alternating voltage differential is zero at an input of oscillator amplifier, the oscillator abruptly changes its oscillating state. The change in oscillation state is detected by the evaluation circuit and converted into a binary switching signal for the load switch.

33 Claims, 6 Drawing Sheets

INDUCTIVE PROXIMITY SWITCH

FIELD OF THE INVENTION

The invention relates to an inductive proximity switch including an oscillator connected to a transmitting coil that generates an alternating magnetic field, with the oscillator being influenced by a metallic trigger penetrating the alternating field and changing the oscillating state of the oscillator. An evaluation circuit receives a switching signal corresponding to the change in the oscillating state.

BACKGROUND OF THE INVENTION

Various methods have been proposed for enabling a detection of the approach of a conductive trigger. For example, in the eddy current method, eddy current losses produced by a trigger in an alternating magnetic field are evaluated. The alternating magnetic field is usually generated by an oscillator with a LC oscillating circuit, which reacts to eddy current losses by the reduced quality of the LC circuit. On reaching a switching criterion, the resultant change in the oscillation amplitude is detected by an evaluation circuit to control a load switch.

Inductive proximity switches based on the eddy current method have been proposed in a number of variations such as, for example in DE-AS 1 286 099.

One disadvantage of proximity switches employing the eddy current method resides in the fact that triggers with different conductivities produce eddy current losses of different magnitudes and hence result in different response distances of the proximity switch. The response distance is reduced, for example, by a reduction factor of $\frac{1}{2}$ to $\frac{1}{3}$ for nonferrous metals in contrast to magnetic steels.

Moreover, in the eddy current method, in addition to the "desired" losses, there are also "parasitic" losses, for example, losses through the winding resistance or in the ferrite material and in the sealing compound which are largely dependent on ambient temperature.

In order to attempt to compensate for the temperature dependency, proximity switches have been proposed in, for example, EP-OS 0 070 796 and DE-OS 3 814 131, wherein special measures are employed to reduce temperature dependence; however, these proposed switches involve considerable technical circuit cost.

It has also been proposed to avoid a change in material-dependent response distance in a proximity switch by using the change in permeability of an LC circuit as a function of the frequency to respond to the approach of the trigger. The change in coil inductance is evaluated as well as the eddy current losses. With correct component values, especially when using highly stable components, it is possible to obtain equal and nearly temperature-independent response distances for ferrous and nonferrous metals. Temperature-independent response distances which exceed the coil diameter cannot be obtained over a wide temperature range, however.

Finally, inductive proximity switches have been proposed in DE-OS 3 840 532, in which two spatially separated sensing coils measure the power loss in the alternating field itself and evaluate it. Although, a proximity switch of this type eliminates the influence of parasitic losses in the response distance, the direct measurement of the sensing signal, using unloaded field-measuring coils, has proven to be very sensitive to interference, in contrast to electromagnetic interference. Furthermore, the circuit expense for the required link between an additional required reference signal and the sensor signal is very high.

OBJECT OF THE INVENTION

It is an object of the present invention to construct a proximity switch in which the influence of temperature on the field strength and frequency is eliminated.

Further, it is an object of the present invention to construct a proximity switch in which, by adjusting the spatial positions and the number of turns of the sensing coil, the alternating voltage differential is zero corresponding to the respective response distance.

SUMMARY OF THE INVENTION

The present invention provides an inductive proximity switch with a low manufacturing cost and a response distance that is large relative to the coil diameter and that is constant over a wide temperature range, for example from $-25°$ C. to $+100°$ C. In addition, the proximity switch should be capable of being designed both as an all-metal switch responding to triggers made of either ferrous or nonferrous metals with the same response distance, or as a selective switch responding either only to ferrous or only to nonferrous metals.

In accordance with advantageous features of the present invention, two sensing coils are arranged in a direct differential circuit within the alternating field to detect the difference between the voltages which are induced in the two sensing coils. The sensing coils are constructed taking into consideration their spatial positions with respect to one another, and the coils have a different number of turns. The alternating voltage differential is zero at the desired response distance, and this differential alternating voltage is fed back to the oscillator amplifier input so that the oscillator suddenly changes its oscillating state in response to the alternating voltage differential of zero.

In a proximity switch of the present invention, the voltages induced in the two sensing coils are an indication of the respective magnetomotive forces generated by the alternating field transmitted by the transmitting coil. By utilizing a high resistance tap, these voltages are proportional to the magnetic flux received by the corresponding sensing coil, and the difference between the induced voltages of each sensing coil, referred to below as the alternating voltage differential, is proportional to the flux gradient. When a trigger of conductive material penetrates the alternating field, edge currents are produced in the trigger and, in turn, build up a magnetic field opposite the alternating field which was generated. The alternating voltage differential also changes in proportion to the resultant change in the flux gradient. The change in the flux gradient is nearly independent of the type of material of which the trigger is composed. When the alternating fields are of a sufficiently high frequency and when the trigger approaches distances which are relatively large to the diameter of the transmitting coil, the alternating voltage differential is also independent of the type of material which the trigger is made. The response distance of the proximity switch, which can vary through wide ranges, no longer depends on the conductivity of the trigger.

In the non-influenced state, the magnitude of the voltages induced in the sensing coils depends on the spatial arrangement of the sensing coils with respect to the alternating field and number of turns of each coil as well as the field strength and frequency of the alternating fields flowing through the sensing coils. To eliminate the influence of temperature on the parameters of field strength and frequency, in the present invention, the spatial positions of the sensing coils and their numbers of turns are tuned to one another so that the alternating voltage differential becomes zero at the respective desired response distance. In addition, the required additional circuit cost is advantageously very low, as a result of the use of the oscillator as an advance evaluation stage. In addition to the components that are normally present in ordinary proximity switches, only the two sensing coils and a certain adjustment of the oscillator amplifier are necessary, and the stability of the oscillator must be sufficient even for only minor demands.

In accordance with advantageous features of the present invention, a transmitting coil can be connected as the inductance of an LC oscillator, so that the input of an oscillator amplifier has a high resistance, and two sensing coils can be connected in series, with opposite polarization of the winding, between a voltage divider and the high-resistance input of the amplifier. The effect of the opposite polarization could be achieved with coils which have the same winding direction by connecting a terminal of one sensing coil with the opposite terminal of the other sensing coil.

By virtue of the above-noted features of the present invention, an oscillator circuit is produced that can operate in two different modes:

In a first operating mode, the alternating voltage differential controls the oscillator amplifier so that the oscillation condition of the oscillator is met in the uninfluenced state. When a trigger approaches, the alternating voltage differential decreases until it reaches a value of zero which corresponds to the trigger at the desired response distance. At this switching criterion, the oscillations of the oscillator cease, with the cessation of oscillations being detected by the evaluation circuit and converted into a switching signal for load switch. If the trigger continues to come closer to the transmitting coil, the value of the alternating voltage differential will rise once again, but the phase angle of the alternating voltage differential will be rotated through 180° relative to the state before the trigger entered the response area, and the oscillation condition will not be met. It is only when the trigger has left the response area that the oscillator again begins to oscillate and build up the alternating field.

In the second operating mode, the oscillator amplifier can be controlled by the alternating voltage differential so that the oscillation condition is not met in the uninfluenced state, and the oscillator does not oscillate. The oscillator begins to oscillate only after the phase change of the alternating voltage differential which is caused by the trigger exceeding the response distance.

In the first operating mode, the oscillator is not additionally loaded by the eddy current losses which are caused by the trigger that is very close to the transmitting coil and the corresponding alternating field which builds up. The oscillator in the first operating mode can generally be designed with lower power.

Advantageously, the oscillation behavior of the oscillator, in which the oscillator amplifier has a sufficiently large amplification factor, is determined in both operating modes exclusively by the passage of the alternating voltage differential through zero, and is not affected by the properties of the transmitting coil or the oscillator amplifier. The response distance of the proximity switch for specific sensing coils corresponds to the spatial position of the sensing coils, and the temperature dependence of the electrical components has little or no effect on the response distance.

To obtain the necessary alternating voltage differential, the two sensing coils are operated in a direct differential circuit, and in other words, they are connected in series, but the windings are opposite to one another, causing a phase shift of 180° between the induced voltages. Thus, keeping the alternating voltage differential directly accessible by the coils being connected in series.

The switching signal is generated by detecting the oscillator amplitude by using an evaluation circuit which, in turn, controls a load switch. The high immunity from interference of the system due to its frequency-selective behavior and the integrating effect of the oscillator is advantageous.

In accordance with still further features of the invention, the oscillator amplifier can be a two-stage transistorized amplifier including an input transistor and an output transistor. The transmitting coil can be connected as an inductance of the LC oscillating circuit of the oscillator and can be located in the collector circuit of the output transistor. The two sensing coils with opposite polarization can be connected in series between the base of the input transistor and the emitter of the output transistor.

A proximity switch incorporating the last-mentioned features of the present invention can also operate in the two operating modes described above. There is an advantage in this, namely, that even with a simple two-stage transistorized amplifier, sufficient amplification is obtained so that the oscillation behavior of the oscillator is determined exclusively by the passage of the alternating voltage differential through zero and not by the properties of the transmitting coil or the oscillating amplifier. Moreover, a voltage divider which utilizes additional resistors can be avoided because the two sensing coils are connected in series. However, the two sensing coils have opposite windings between the high-resistance base of the input transistor and the emitter of the output transistor. The available components of the second transistorized amplifier stage form an appropriate voltage divider.

The operating frequency of the oscillator is of critical importance for the response of the proximity switch to a trigger. If the oscillator according to the present invention is designed for an operating frequency of more than 20 kHz, preferably between 50 kHz and 1 mHz, and if the sensing coils, by virtue of their spatial positions with respect to one another and the respective numbers of turns, are so designed that when the alternating voltage differential corresponding to a trigger made of ferrous or non-ferrous metal becomes zero at the same switching distance, an all-metal switch is provided.

surprisingly, excellent selective switching behavior can also be achieved with the proximity switch according to the present invention. In other words, response only to non-ferrous metals (NF) or response only to ferrous metals (FE) can be achieved while the operating frequency of the oscillator is changed.

Thus, for example, selective switching behavior according to the invention can be obtained by setting the oscillator to an operating frequency preferably between 1 kHz and 10 kHz, and constructing the sensing coils, with respect to their spatial positions relative to one another and their respective numbers of turns, such that the alternating voltage differential becomes zero only when an FE-trigger comes within the desired switching distance, while the alternating voltage differential never becomes zero over the entire possible approach range of the trigger when an NF metal trigger approaches.

Conversely, however, it is possible for the alternating voltage differential to be zero only when the NF trigger approaches and not when the FE-trigger approaches, with the oscillator, in turn, being designed for the operating frequency preferably between 1 kHz and 10 kHz, the suitable spatial position of the two sensing coils and the suitable number of turns being provided for the sensing coils.

The cause of the different behavior of the proximity switch corresponding to the operating frequency of the oscillator is the frequency-dependent permeability of iron for example and the different field changes that result from the different depths of penetration for different types of materials. Thus, for example the permeability of iron is initially high at low frequencies, but then drops off sharply above a certain frequency.

Electrically conductive triggers have the property of "pushing" the field away from conductive materials, so to speak, while magnetic conductive triggers "pull" the field into the trigger.

Thus, with a sufficiently low operating frequency even for iron, the "pulling" effect dominates the field repulsion effect. In low-loss magnetic materials, ferrites for example, there is only the "pulling" effect. FE metals therefore cause the field to grow stronger in the space between the transmitting coil and the trigger, while NF metals cause the field to weaken. It is therefore possible to construct sensing coils by appropriately adjusting their spatial positions with respect to one another, as well as their respective numbers of turns, in such a way that the oscillator changes its oscillating state only when NF triggers approach or only when FE triggers approach.

According to the invention, provision can be made such that the transmitting coil and the two sensing coils are arranged coaxially as air coils on a common coil body made of plastic or ceramic. This makes it possible to locate the proximity switch with its back, opposite the response side, against a metal wall, and the response distance is not significantly changed.

Any changes in the response distance can be corrected when, according to other features of the invention, the transmitting coil is located centrally and displaceably between the sensing coils. If necessary, it is even possible, depending on the influence from the back of the proximity switch, to bring the response distance closer to the metal wall, since an air coil arrangement, by virtue of the large coil spacings, permits high alternating voltage differentials, considerably increasing the sensitivity of the proximity switch.

At a large response distance, minor temperature dependencies occur because of the thermally induced expansion of the coil supports. To avoid such a change in the response distance, according to the present invention, magnetic material with a known temperature-dependent permeability behavior can be located in the field of the sensing coils to compensate for the temperature drifts that occur at large coil spacings. It has proven advantageous in this design to place the magnetic material in a recess of the coil body in the vicinity of the sensing coil and facing away from the trigger, for example with a surface of 4 mm² and a coil diameter of 30 mm.

Moreover, the proximity switch with an air coil arrangement has proven to be suitable for use in welding systems; in other words, the air coil arrangement is insensitive to interference from external magnetic fields, since there is no longer any ferrite core which could have an unfavorable influence on the switching behavior of the proximity switch as a result of saturation by external magnetic fields. Likewise, the response distance remains unaffected by aging of the ferrite core.

In a flush installation of the proximity switch according to the present invention, provision can be made to locate the coil arrangement in a metal shield open to the trigger. This shielding can also be in the form of a metal cylinder. It is possible to make such shielding metal cups and cylinders in several layers, and the individual metal layers exhibits different magnetic behavior.

In addition, provision can be made according to the present invention such that a compensating coil is mounted concentrically on the open side of the metal shielding and connected in series with the transmitting coil in that the current flow direction of the compensating coil is opposite to the flow direction of the transmitting coil. Hence, the product of a number of windings n and the current I of the compensating coil is about 5% of the product (n×I) of the transmitting coil. As a result, the magnetic field of the transmitting coil is quasi-rectified and insulated from the installation wall. In other words, $n_k = 0.05 \times I1/I2 \times n_s$.

In addition to rear mounting of the proximity switch on metal surfaces or flush installation in metal surfaces, users require additional application options for proximity switches. Thus, proximity switches are required which have a constant response distance even under especially rough environmental conditions, such as high pressures, high temperatures, and in liquids, as well as in explosion-proof designs. In order to meet these requirements, the coils can be disposed in a one-piece pot-shaped metal housing which is closed on the side facing the trigger. This provides the advantage that the quality of the oscillating circuit is only a secondary role in the evaluation of the proximity switch, so that a metallic trigger can be detected even through a thick metal wall.

To ensure that the magnetic field that originates from the transmitting coil and passes through the bottom of the pot-shaped housing is attenuated as little as possible, additional provisions are made according to the present invention such that an oscillator frequency is between 1 kHz and 10 kHz. Thus, the wall thickness of the metal housing in the vicinity of the field emerging toward the trigger is less than the skin depth. This can be accomplished by making the metal housing of a metal that is a poor electrical conductor and has low permeability, for example, titanium or V2A or V4A steel.

Accordingly, a proximity switch according to the present invention can respond to the trigger in the open design despite the relatively thick metal walls.

In its response to the trigger, the proximity switch according to the present invention shows considerable improvement over known proximity switches also with respect to its nearly temperature-independent response distance.

The proximity switch according to the invention can be designed to be so sensitive that it responds to the smallest changes in position of the trigger which is mounted for example on a movable pressure or temperature sensor, so that it can be used as a pressure or temperature monitor.

Additional spatial arrangements of the transmitting coils on the two sensing coils are described in the claims.

BRIEF DESCRIPTION OF THE DRAWINGS

The above and other objects, features and advantages of the present invention will become more apparent from the following description when taken in connection with the accompanying drawings, which show, for the purpose of illustration only, several embodiments in accordance with the present invention, and wherein.

DESCRIPTION OF THE PREFERRED EMBODIMENTS

Figure 1:
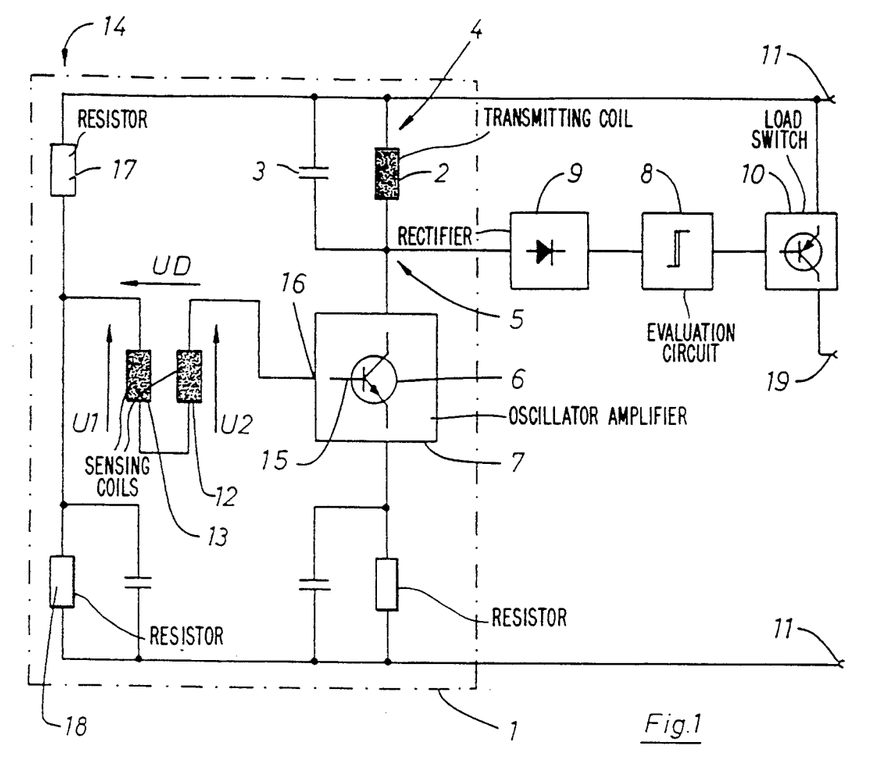
FIG. 1 is a circuit diagram of a proximity switch according to the invention.

In the proximity switch according to FIG. 1, an alternating field is generated by an oscillator 1 through a transmitting coil 2 which acts as an inductance together with a capacitor 3 to form LC oscillator circuit 4 of oscillator 1. The LC oscillator circuit 4 is in a collector circuit 5 of amplifier transistor 6. The oscillation state of the oscillator is detected by evaluation circuit 8 through rectifier circuit 9 and connected to oscillator amplifier 7 through collector circuit 5 and converted by the latter into a binary switching signal. A load switch 10, oscillator 1, rectifier circuit 9, and evaluation circuit 8 are powered through terminals 11.

The alternating field of transmitting coil 2 includes two sensing coils 12, 13 of a direct differential circuit between a voltage divider 14 and the base 15 of amplifier transistor 6 and/or the high-resistance input 16 of oscillator amplifier 7. Resistors 17 and 18 as well as the RC combination located in the emitter circuit establish the bias point of the transistor. The alternating voltage differential UD which is composed of the difference between voltages U1 and U2 induced in the sensing coils controls the oscillation behavior of oscillator 1.

The oscillation state of oscillator 1 is detected by evaluation circuit 8 which accordingly controls load switch 10, which switches a load, not shown, in its load circuit 19.

Figure 2:
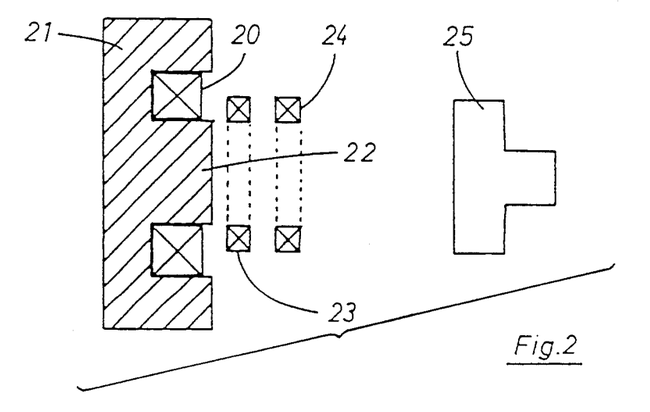
FIG. 2 is a partial cross-sectional exploded schematic view of a spatial arrangement of transmitting and sensing coils of a proximity switch constructed in accordance with the present invention, with a trigger approaching the switch.
Figure 3:
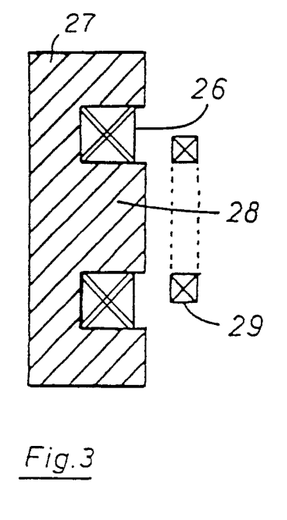
FIGS. 3-5 are schematic cross-sectional views of other spatial arrangements of transmitting and sensing coils of proximity switches constructed in accordance with the present invention.

FIG. 2 illustrates transmitting coil 20 located in a ferrite pot 21 on a middle core 22, while, as illustrated in FIG. 3, the other sensing coil 29 is located coaxially in the alternating field in front of bifilar winding 26. In FIG. 2, both sensing coils 23 and 24 are located between the ferrite pot 21 on the side of trigger 25.

FIG. 3 illustrates that the transmitting coil and the sensing coils are bifilarly wound in a bifilar manner as by bifilar winding 26 located inside ferrite pot 27. The sensing coil 29 is located in front of ferrite pot 27.

Figure 4:
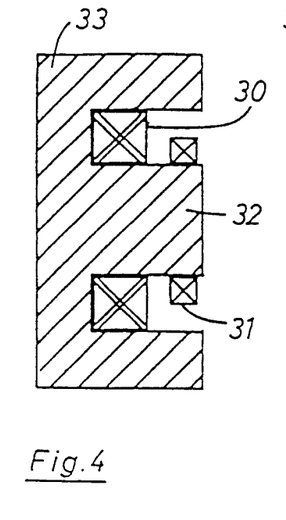

In FIG. 4, bifilar winding 30 and the other sensing coil 31 are located in ferrite pot 33 coaxially, one behind the other, on middle core 32 of ferrite pot 33.

Figure 5:
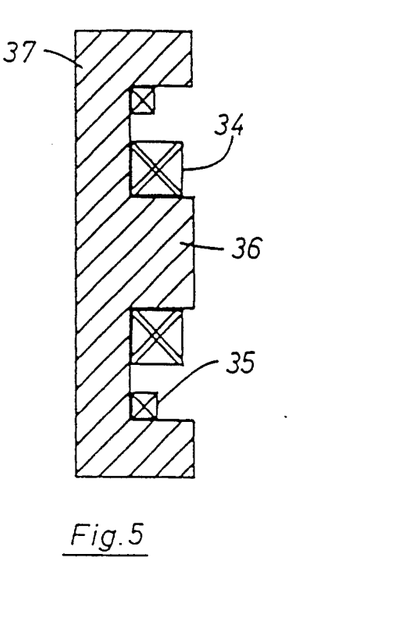

In FIG. 5, a concentric arrangement of bifilar winding 34 of the sensing coil on central core 36 and of sensing coil 35 inside ferrite pot 37 is illustrated. The transmitting coil could be axially next to bifilar winding 30.

Figure 6:
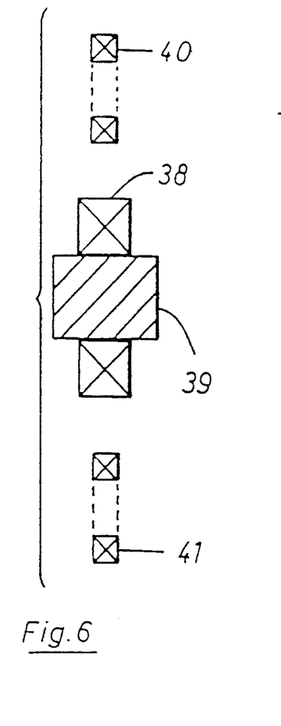
FIG. 6 is an exploded schematic cross-sectional view of yet another spatial arrangement of a transmitting and sensing coil of a proximity switch constructed in accordance with the present invention.

In the spatial arrangement of FIG. 6, a transmitting coil 38 is located centrally on a ferrite core 39 between the two sensing coils 40 and 41, with all coils having their ring planes lying in a common plane, and sensing coils 40, 41 are positioned outwardly of transmitting coil 38 centrally between them.

Figure 7:
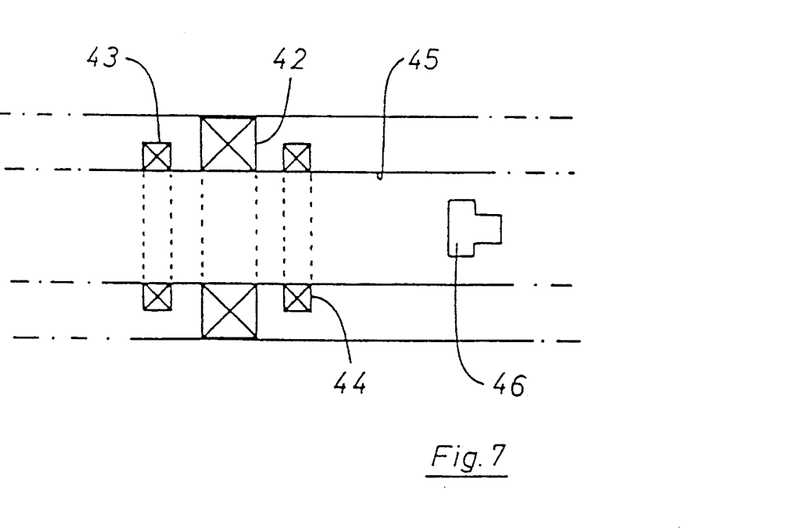
FIG. 7 is a schematic view of a further spatial arrangement of transmitting and sensing coils of a proximity switch constructed in accordance with the present invention, with a trigger approaching.

FIG. 7 illustrates a central coaxial arrangement of transmitting coil 42 between sensing coils 43 and 44, with all the coils lying flush with the inside wall of tube 45 so that the proximity switch responds to a trigger 46 moving through the tube and the coils.

Figure 8:
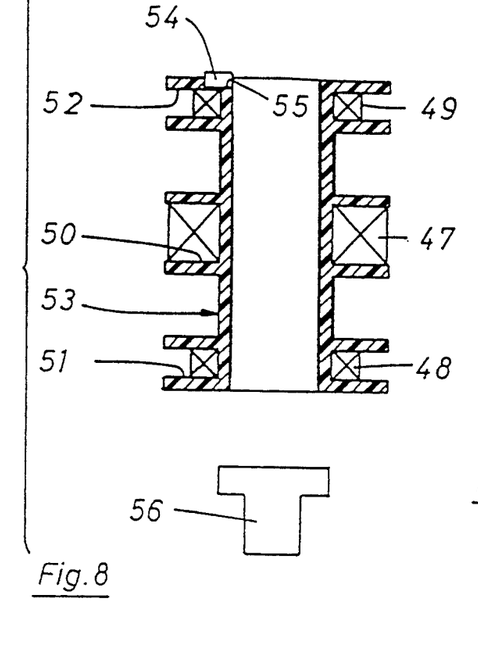
FIG. 8 is a partial cross-sectional exploded schematic view of a still further spatial arrangement of transmitting and sensing coils of a proximity switch constructed in accordance with the present invention, with a trigger approaching.

In FIG. 8, air coils are shown, with a transmitting coil 47 being located centrally and coaxially between sensing coils 48 and 49. The three coils are located in three chambers 50, 51 and 52 of a common non-ferritic coil body 53 made of ceramic or plastic for example. FIG. 8 also shows a magnetic material part 54 located in a recess 55 of coil body 53 in the vicinity of sensing coil 49 and facing away from trigger 56. Magnetic material part 54 compensates for temperature-caused relative movement between coils 47, 48 and 49 which are located relatively far apart. Magnetic material part 54 has a known temperature-dependent permeability behavior, being placed in the field of sensing coils 48, 49.

Figure 9:
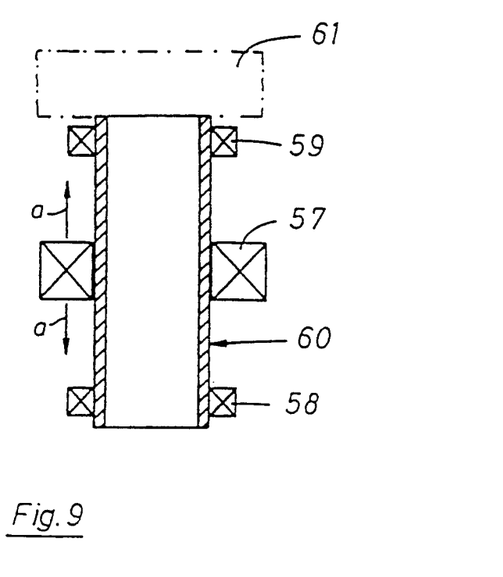
FIG. 9 is a schematic cross-sectional view of a still further spatial arrangement of transmitting and sensing coils of a proximity switch constructed in accordance with the present invention.

In FIG. 9, a centrally located transmitting coil 57 is axially displaceable in the direction of arrow a on coil body 60 which is common to transmitting coil 57 and sensing coils 58 and 59. This makes it possible to compensate for the influence of rear metallic mounting wall 61 on the response distance of the proximity switch.

Figure 10:
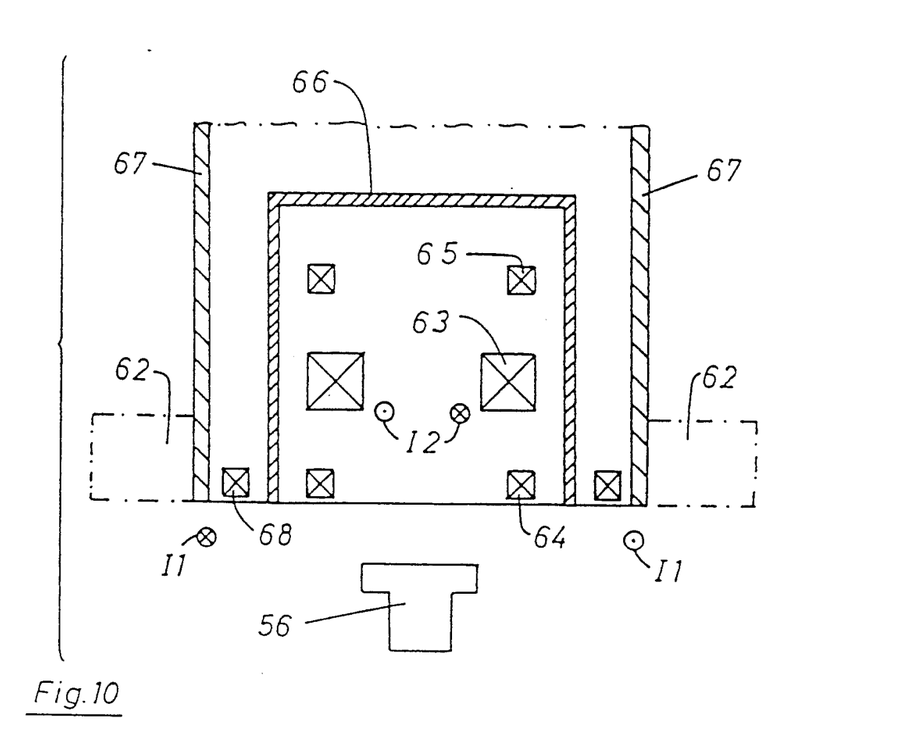
FIG. 10 is a partial cross-sectional exploded schematic view of a system of coils including shields for a flush installation of a proximity switch in a metal wall.

FIG. 10 shows a proximity switch which is suitable for flush installation in metal installation wall 62, in which transmitting coil 63 is located coaxially between sensing coils 64 and 65, and the entire coil arrangement is located within a metal shield 66 which is open toward trigger 56. Between metal shielding 66 and sensor housing 67, a compensating coil 68 is shown on the response side or open side as a further shielding measure for shielding and concentrating the escaping field from transmitting coil 63. The compensating coil 68 is connected in series with the transmitting coil 63 such that the direction of current I1 in compensating coil 68 is opposite the direction of current I2 of transmitting coil 63.

Figure 11:
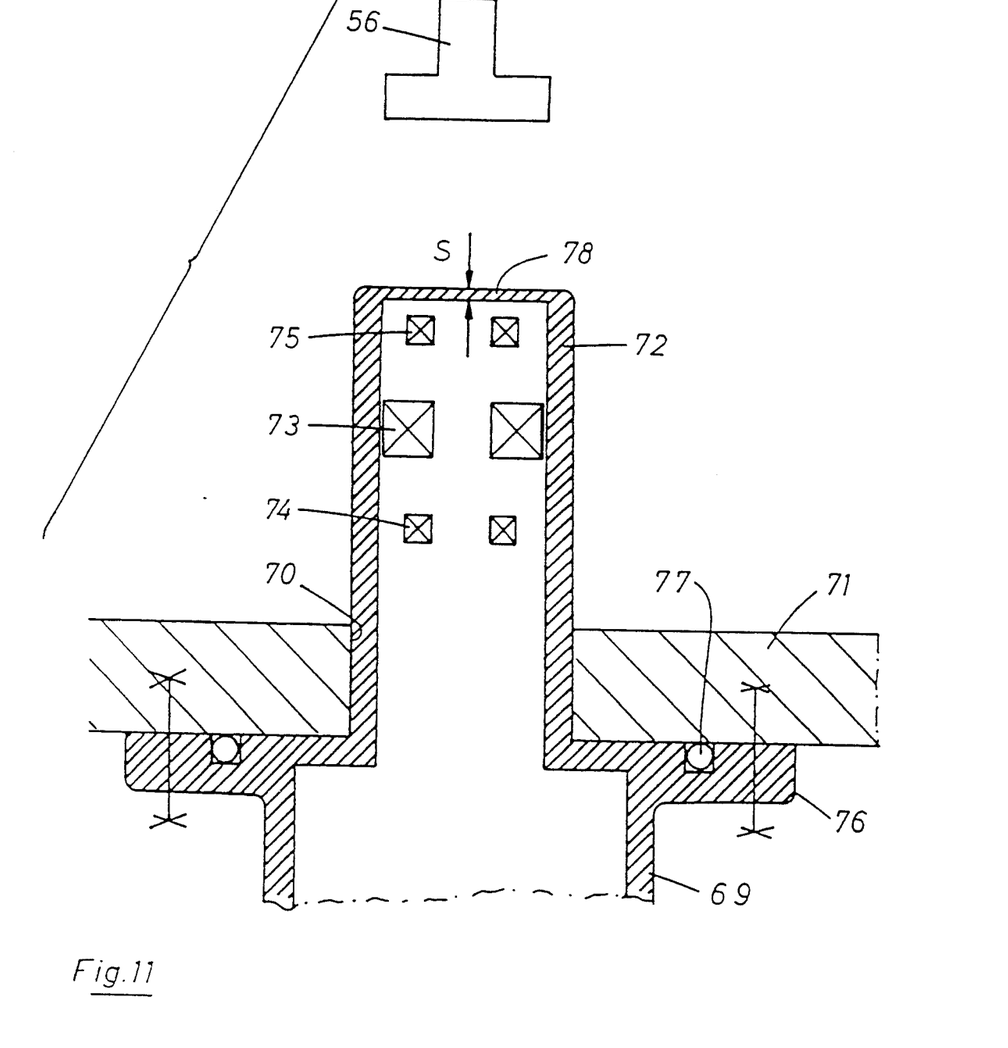
FIG. 11 is a partial cross-sectional exploded schematic view of a proximity switch arrangement constructed in accordance with the present invention in a pressure-resistant and explosion-proof construction.

FIG. 11 shows a pressure-resistant and explosion-proof embodiment of the proximity switch. Housing 69 of the proximity switch has a sensor head 72 which is smaller in diameter and is extended through an opening 70 in mounting wall 71, with coils 73, 74, and 75 being arranged coaxially in the head. A sealing ring 77 is clamped between mounting wall 71 and an annular shoulder 76 of the housing. Wall 71 can be the wall of a pressure vessel which sensor head 72 penetrates.

In the pressure-resistant and explosion-proof proximity switches with the pot-shaped all-metal housings according to the invention, the thickness S of metal wall 78 at the end, traversed by the field from transmitting coil 73, is much less than the skin depth for the given operating frequency. This is determined particularly at a frequency between 1 kHz and 10 kHz by virtue of the fact that a poor conducting metal with low permeability such as titanium or nonmagnetic steel is used for housing 69.

Figure 12:
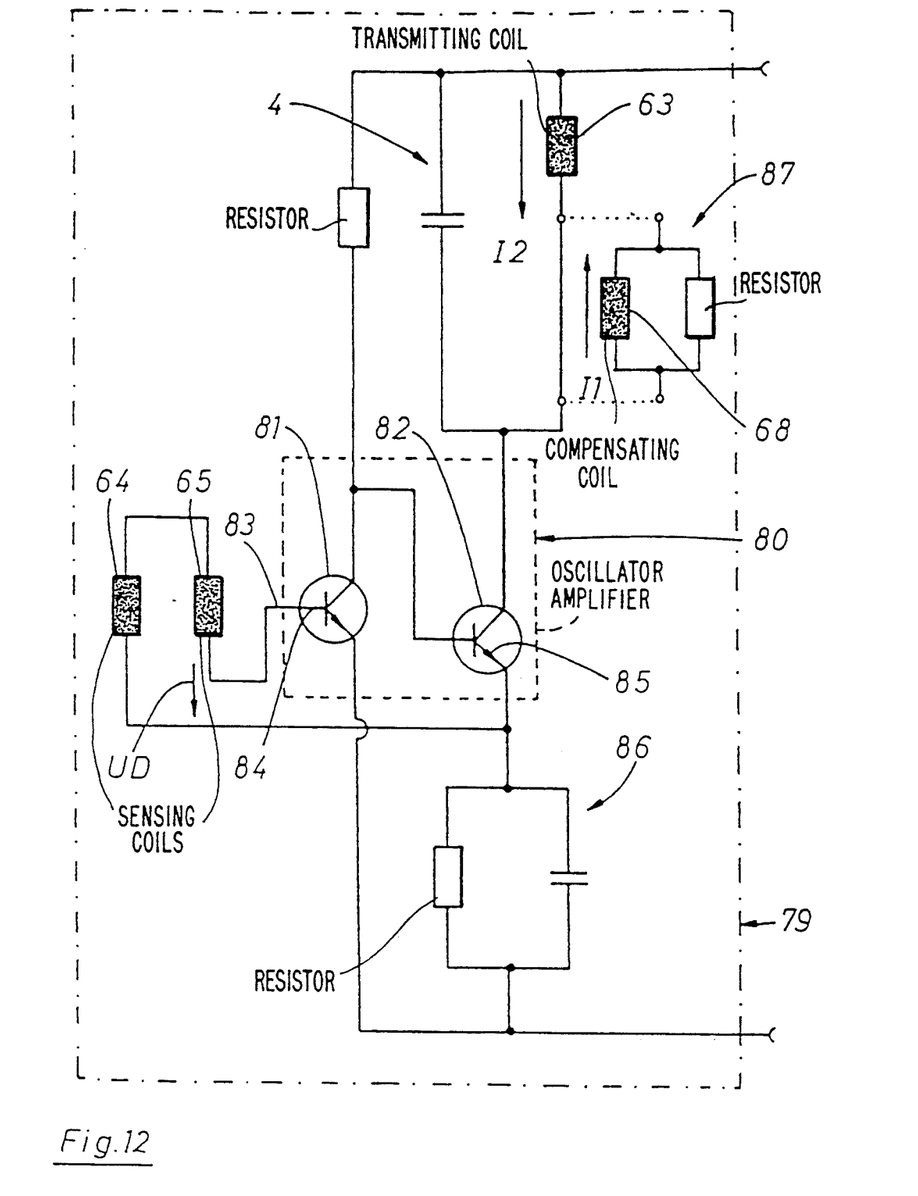
FIG. 12 is a circuit diagram of an oscillator for a proximity switch constructed in accordance with the present invention.

FIG. 12 shows a circuit diagram of oscillator 79 of the proximity switch according to the invention. Oscillator amplifier 80 is designed as a two-stage transistorized amplifier with an input transistor 81 and an output transistor 82. High-resistance input 83 of oscillator amplifier 80 is formed by base 84 of input transistor 81. Sensing coils 64 and 65 are connected with a direct differential circuit with opposite polarization between base 84 and emitter 85 of output transistor 82. Consequently, there is no need for the separate voltage divider 14 as shown in FIG. 1 since the voltage drop is utilized by RC combination 86 and by the amplifier circuit. Transmitting coil 63 is in the collector circuit of output transistor 82.

In the case of proximity switches to be mounted flush (see FIG. 10), a RL combination 87 can be connected in series with transmitting coil 63, with the winding of compensating coil 68 being opposite to the winding of transmitting coil 63. By this means, the direction of current I1 in compensating coil 68 is opposite to the direction of current I2 in transmitting coil 63. When compensating coil 68 is located between metal mounting wall 62 and sensing coil 64, a better directional characteristic of the magnetic field is obtained near mounting wall 62.

Referencing FIG. 13, which corresponds to the spatial arrangement of transmitting and sensing coils of the proximity switch of FIG. 8, several examples of proximity switches are described below.

EXAMPLE 1

Figure 13:
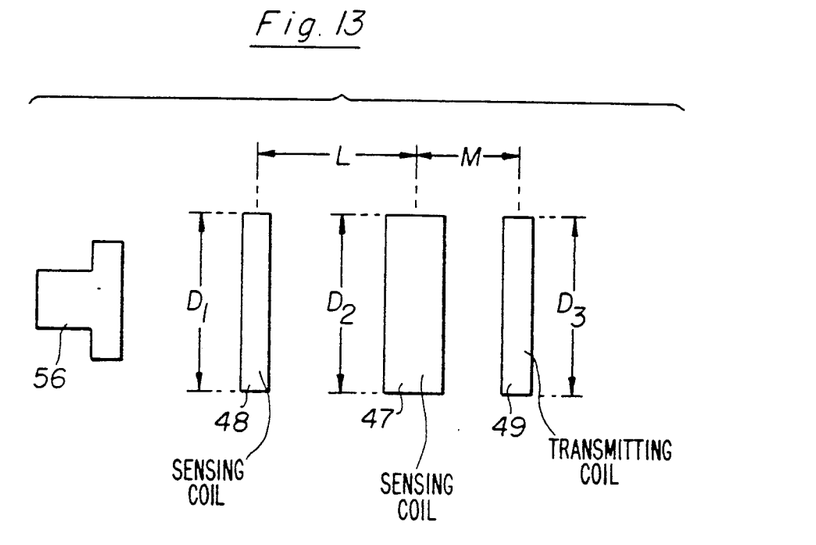
FIG. 13 is a schematic cross-sectional view of a still further spatial arrangement of transmitting and sensing coils of a proximity switch constructed in accordance with the present invention, with a trigger approaching.

An arrangement of the all metal switch for detecting both ferrous FE and non-ferrous NF triggers is illustrated in FIG. 13. The transmitting coil 47 includes varnished copper wire, which is 0.15 mm in diameter, and sensing coils 48 and 49 include varnished copper wire, which is 0.1 mm in diameter. The winding cross sectional area of coils 47, 48 and 49 is less than 1 mm$^2$, and the number of turns of transmitting coil 47 and sensing coils 48 and 49 is 20, 12 and 6 turns, respectively. The diameters $D_1$, $D_2$ and $D_3$ of coils 48, 47 and 49, respectively, are 33 mm, and distance L between sensing coil 48 and transmitting coil 47 is 7.5 mm. The distance M between transmitting coil 47 and sensing coil 49 is 3 mm. The capacitance of capacitor of LC oscillator circuit 4 is 2,200 picofarads.

The two different apparatus modes as described above are achieved by the winding direction or polarity of the transmitting coil. In a first mode, the alternating voltage differential is adjusted such that the oscillator oscillates in the uninfluenced state, and the oscillations cease as the metal trigger approaches the desired response distance. Alternatively, in the second mode, the alternating voltage differential is adjusted such that the oscillator does not oscillate in the uninfluenced state, and the oscillator oscillates as the trigger is within the desired response distance.

EXAMPLE 2

Another all metal switch for detecting both ferrous Fe and non-ferrous NF is similar to the switch of Example 1 except the number of turns of both sensing coil 48 and 49 is 5 turns; diameters $D_1$ and $D_2$ of sensing coils 48 and transmitting coil 47, respectively, are 33 mm; and diameter $D_3$ of sensing coil 49 is 26 mm.

EXAMPLE 3

The non-ferrous switch, which detects only non-ferrous NF triggers, is similar to the switch of Example 1 except that the winding cross-sectional area of sensing coils 48 and 49 is less than 1 mm$^2$; the winding cross-sectional area of transmitting coil 47 is approximately 3 mm$^2$; the number of turns of the transmitting coil 47 is 300 turns; and the capacitance of the capacitor of LC oscillator circuit 4 is 0.22 microfarad. In the first mode and the second mode, the alternating voltage differential is adjusted as described in Example 1, and the oscillator is unaffected as the ferrous trigger approaches.

EXAMPLE 4

The ferrous switch, which detects only ferrous triggers, is similar to the switch of Example 3 except that in the first mode, the alternating voltage differential is adjusted such that the oscillator oscillates in the uninfluenced state and does not oscillate as the ferrous trigger approaches the desired response distance, and in the second mode, the alternating voltage differential is adjusted such that the oscillator does not oscillate in the uninfluenced state, and the oscillator begins to oscillate as the ferrous trigger approaches the desired response distance. The approach of the non-ferrous trigger does not affect the oscillation state in either the first or the second mode.

While I have shown and described several embodiments in accordance with the present invention, it is understood that the same is not limited thereto but is susceptible to numerous modifications as known to one skilled in the art and I therefore do not wish to be limited to the details described herein, but intend to cover all such modifications as are encompassed by the scope of the appended claims.

I claim:

1. An inductive proximity switch comprising:
   an oscillator circuit having two states of oscillation which states are changed when a detection signal is received, said oscillator circuit including an oscillator amplifier and a transmitting coil for transmitting an alternating magnetic field;

a detector for detecting a disturbance of a flux gradient of the alternating magnetic field which disturbance is caused by a metallic target moving from outside into the alternating magnetic field, said detector generating said detection signal in response to said disturbance; and an evaluation circuit for differentiating between said two states of oscillation and for causing a switching of the proximity switch at each change between the states of oscillation; and wherein said detector includes a first sensing coil and a second sensing coil, said coils are separated from said transmitting coil and are connected in series and in reverse winding directions to produce an alternating voltage differential with said alternating voltage differential only becoming zero when the target has approached a predetermined distance to the proximity switch, and the alternating voltage differential is supplied as a control input to said oscillator amplifier which each time the alternating voltage differential becomes zero causes a changing between said two states of oscillation so that the oscillator circuit functions as an advance evaluation stage for the detecting signal and delivery only two different output signals to said evaluation circuit.

2. A proximity switch according to claim 1, wherein:
said transmitting coil and said first and second sensing coils are disposed coaxially.

3. A proximity switch according to claim 2 wherein:
said transmitting coil is located in a ferrite pot having a central core and said first and second sensing coils are located between said ferrite pot and said metallic trigger.

4. A proximity switch according to claim 3 wherein:
said transmitting coil and said first sensing coil are a bifilar winding with the bifilar winding being located within a channel of said ferrite pot.

5. A proximity switch according to claim 3 wherein:
said second sensing coil is located adjacent to said ferrite pot.

6. A proximity switch according to claim 4 wherein:
the second sensing coil is located within said channel of said ferrite pot and is located concentrically with respect to said bifilar winding of said first sensing coil and said transmitting coil.

7. A proximity switch according to claim 4 wherein:
said second sensing coil is located axially adjacent to said bifilar winding.

8. A proximity switch according to claim 2 wherein:
said transmitting coil is located between said first and second sensing coils within a tube.

9. A proximity switch according to claim 1 wherein:
said first sensing coil has a first axis and said second sensing coil has a second axis with said first axis being parallel to said second axis and said transmitting coil is located between said first and second sensing coils.

10. A proximity switch according to claim 1 wherein:
said transmitting coil and said first and second sensing coils are coaxially disposed and said transmitting coil and said first and second sensing coils are air coils mounted on a common coil body with said common coil body being either plastic or ceramic.

11. A proximity switch according to claim 10 wherein:
said transmitting coil is located substantially centrally between said first and second sensing coils.

12. A proximity switch according to claim 11 wherein:
said transmitting coil is axially displaceable.

13. A proximity switch according to claim 10 wherein:
a magnetic material member having temperature-dependent permeability characteristics is located in a field of said first and second sensing coils to compensate for a temperature drift that occurs at a distance between said transmitting coil, said first sensing coil and said second sensing coil.

14. A proximity switch according to claim 13 wherein:
said magnetic material member is located within a recess of said common coil body in proximity to one of said first or second sensing coils, said common coil body being between said magnetic material member and said metallic trigger.

15. A proximity switch according to claim 13 wherein:
said magnetic material member has a surface area of approximately 4 mm$^2$ and a coil diameter of approximately 30 mm.

16. A proximity switch according to claim 1 wherein:
said transmitting coil and said first and second sensing coils are located within a recess of a metal shield which is open to face said metallic trigger.

17. A proximity switch according to claim 16 wherein:
a compensating coil is mounted concentrically on an open side of said metal shield and is connected in series to said transmitting coil such that a first direction of a first current of the compensating coil is opposite to a second direction of a second current of said transmitting coil.

18. A proximity switch according to claim 17 wherein:
a first number of turns of said compensating coil is approximately equal to 5% of a second number of turns of said transmitting coil multiplied by a ratio of a second magnitude of said second current of said transmitting coil to a first magnitude of said first current of said compensating coil.

19. A proximity switch according to claim 1 wherein:
said transmitting coil and said first and second sensing coils are located in a one-piece pot-shaped metal housing which is closed on the side facing said trigger.

20. A proximity switch according to claim 19 wherein:
said oscillator circuit has an oscillator frequency between 1 kHz and 10 kHz and said one-piece pot-shaped metal housing includes a wall housing having a wall thickness in a surface area in which said transmitting coil emits said alternating magnetic field in a direction of the metallic trigger and is less than a skin depth at a predetermined oscillator frequency.

21. A proximity switch according to claim 20 wherein:
said metal housing is made of a metal having a poor electrical conductivity and low permeability.

22. A proximity switch as in claim 16 wherein:
said metal is titanium.

23. A proximity switch as in claim 16 wherein:
said metal is V2A steel.

24. A proximity switch as in claim 16 wherein:
said metal is V4A steel.

25. A proximity switch as in claim 1 wherein:
said first coil and said second coil have a different number of turns.

26. A proximity switch as in claim 1 wherein:
said first coil and said second coil are disposed at different distances from said transmitting coil.

27. A proximity switch as in claim 1 wherein:
said first and second coil are disposed at different distances from said target.

28. A proximity switch as in claim 1 wherein:
said oscillator circuit has an operating frequency between 1 kHz and 10 kHz and said detector generates said detection signal in response to said disturbance of a ferrous metal trigger and does not generate said detection signal in response to a non-ferrous metal trigger.

29. A proximity switch as in claim 1 wherein:
said oscillator circuit generates an operating frequency between 1 kHz and 10 kHz and said detector generates said detection signal in response to said disturbance of a non-ferrous trigger and does not generate said detection signal in response to a ferrous trigger.

30. A proximity switch according to claim 1 wherein:
said transmitting coil is an inductor of an LC circuit of said oscillator circuit and said oscillator amplifier of said oscillator circuit has a high resistance input and said first and second sensing coils are connected between a voltage divider circuit and said high resistance input of said oscillator amplifier.

31. A proximity switch according to claim 1 wherein:
said oscillator amplifier is a two-stage transistorized amplifier including an input transistor and an output transistor, said transmitting coil is an inductor, said oscillator circuit is an LC oscillator, said transmitting coil is connected to a collector of said output transistor and said first and second sensing coils are connected in series between a base of said input transistor and an emitter of said output transistor.

32. A proximity switch according to claim 1 wherein:
said oscillator circuit operates at a first frequency of at least 20 kHz and said detector generates said detection signal in response to said disturbance of a ferrous and a non-ferrous metal trigger at a predetermined distance.

33. A proximity switch according to claim 32 wherein:
said first frequency is between 50 kHz and 1 MHz.

* * * * *